United States Patent
Ruehrig et al.

(10) Patent No.: US 7,436,700 B2
(45) Date of Patent: *Oct. 14, 2008

(54) MRAM MEMORY CELL HAVING A WEAK INTRINSIC ANISOTROPIC STORAGE LAYER AND METHOD OF PRODUCING THE SAME

(75) Inventors: Manfred Ruehrig, Eckental (DE); Joachim Wecker, Roettenbach (DE); Ulrich Klostermann, München (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 11/769,454

(22) Filed: Jun. 27, 2007

(65) Prior Publication Data

US 2008/0002462 A1  Jan. 3, 2008

Related U.S. Application Data

(63) Continuation-in-part of application No. 11/634,988, filed on Dec. 7, 2006, now Pat. No. 7,280,393, and a continuation of application No. 11/051,471, filed on Feb. 7, 2005, now abandoned.

(30) Foreign Application Priority Data

Feb. 6, 2004 (DE) ........................ 10 2004 005 921
Jan. 28, 2005 (DE) ........................ 10 2005 004 126

(51) Int. Cl.
  *G11C 11/00*  (2006.01)
(52) U.S. Cl. ........................ 365/158; 365/171; 365/173; 438/3

(58) Field of Classification Search ................. 257/421, 257/427; 365/158, 171, 173; 438/3
See application file for complete search history.

(56) References Cited

U.S. PATENT DOCUMENTS 5,953,248 A  9/1999 Chen et al.
5,966,323 A  10/1999 Chen et al.

(Continued)

OTHER PUBLICATIONS

R. P. Cowburn, "Property variation with shape in magnetic nanoelements," J. Phys. D: Appl. Phys. 33 (2000), pp. R1-R16.

(Continued)

*Primary Examiner*—VanThu Nguyen
*Assistant Examiner*—Alexander Sofocleous
(74) *Attorney, Agent, or Firm*—Edell, Shapiro & Finnan, LLC (57) ABSTRACT

An MRAM memory cell is provided having a layer system made of circular-disk-shaped layers. The memory cell includes first and second magnetic layers separated by a non-magnetic intermediate layer. The first magnetic layer exhibits hard-magnetic behavior and serves as a reference layer. The second magnetic layer exhibits soft-magnetic behavior and serves as a storage layer. An antiferromagnetic layer may be provided on the storage layer. Information is stored by the magnetization state of the storage layer. The storage layer has a weak intrinsic anisotropy that defines a magnetic preferred direction. The magnetization direction of the reference layer is parallel to the magnetization direction of a remanent magnetization in the interior of the storage layer. The remanent magnetization occurs as a result of applying an external magnetic field with a field component perpendicular to the preferred direction of the intrinsic anisotropy of the storage layer.

28 Claims, 4 Drawing Sheets

U.S. PATENT DOCUMENTS

| | | | |
|---|---|---|---|
| 5,982,660 | A | 11/1999 | Bhattacharyya et al. |
| 6,483,741 | B1 * | 11/2002 | Iwasaki et al. ............... 365/170 |
| 6,531,723 | B1 | 3/2003 | Engel et al. |
| 6,654,278 | B1 | 11/2003 | Engel et al. |
| 6,936,903 | B2 | 8/2005 | Anthony et al. |
| 2003/0063492 | A1 | 4/2003 | Ruhrig et al. |

OTHER PUBLICATIONS

Daniel Braun, "Effect of crystalline disorder on magnetic switching in small magnetic cells," Journal of Magnetism and Magnetic Materials 261 (2003), pp. 295-303.

L. D. Buda, et al., "Micromagnetic simulations of magnetization in circular cobalt dots," Computational Materials Science 24 (2002), pp. 181-185.

M. Demand, et al., "Magnetic domain structures in arrays of submicron Co dots studied with magnetic force microscopy," Journal of Applied Physics, vol. 87, No. 9, May 1, 2000, pp. 5111-5113.

J. Fidler, et al., "Micromagnetic simulation of the magnetic switching behaviour of mesoscopic and nanoscopic structures," Computational Materials Science 24 (2002), pp. 163-174.

K. Y. Guslienko, et al., "Magnetization reversal due to vortex nucleation, displacement, and annihilation in submicron ferromagnetic dot arrays," Physical Review B., vol. 65, pp. 024414-1-024414-10.

Jihg Shi et al., "Geometry dependence of magnetization vortices in patterned submicron NiFe elements," Applied Physics Letters, vol. 76, No. 18, May 1, 2000, pp. 2588-2590.

Jonathan Kin Ha, et al., "Micromagnetic study of magnetic configurations in submicron permalloy disks," Physical Review B., 67, (2003), pp. 224432-1-224432-9.

Horst Hoffmann, "Influence of local inhomogeneities on the magnetic properties of thin ferromagnetic films and nanostructures," Thin Solid Films 3763 (2000), pp. 107-112.

* cited by examiner

MRAM MEMORY CELL HAVING A WEAK INTRINSIC ANISOTROPIC STORAGE LAYER AND METHOD OF PRODUCING THE SAME

CROSS REFERENCE TO RELATED APPLICATIONS

This application is a continuation-in-part application of U.S. application Ser. No. 11/634,988, filed Dec. 7, 2006, which in turn is a continuation of U.S. application Ser. No. 11/051,471 filed on Feb. 7, 2005, which claims priority under 35 USC §119 to German Application No. DE 10 2004 005 921.7, filed on Feb. 6, 2004, and to German Application No. DE 10 2005 004 126.4, filed on Jan. 28, 2005. The entire contents of each of the aforementioned applications are hereby incorporated by reference.

FIELD OF THE INVENTION

The present invention relates to memory devices, and more particularly, to a Magnetic Random Access Memory (MRAM) memory cell having a layer system of substantially circular-disk-shaped layers and a method for producing an MRAM memory cell.

BACKGROUND OF THE INVENTION

MRAM devices are a promising alternative to conventional dynamic semiconductor memories. MRAMs are nonvolatile memories, which, in contrast to conventional dynamic semiconductor memories, do not need a refresh process for information retention. MRAM memory cells are substantially formed of two magnetic layers with a nonmagnetic layer arranged in between the two magnetic layers. MRAMs are resistant to radiation, so that information retention is ensured even when radiation is incident.

An MRAM memory cell is based on ferromagnetic storage with the aid of the tunneling magnetoresistance (TMR) effect or the giant magnetoresistance (GMR) effect. A conventional MRAM cell is constructed of a layer stack comprising a soft-magnetic layer (storage layer), a tunnel oxide layer and a hard-magnetic layer (reference layer) arranged at the crossover point between bit and word lines. Magnetization of the reference layer is predefined, while the magnetization of the storage layer is adjustable by sending corresponding currents in different directions through the word line and the bit line. By controlling these currents, the magnetization of the storage layer can be set parallel or antiparallel with respect to the magnetization of the reference layer. In the case of a parallel magnetization of storage layer and reference layer, the electrical resistance in the stack direction of the layer stack (i.e., from top to bottom or vice versa) is less than in the case of an antiparallel magnetization of storage layer and reference layer. This electrical resistance dependent on the different magnetization directions of the two layers can be evaluated as logic state "0" or "1".

The magnetization of the storage layer that is parallel or antiparallel with respect to the reference layer is enabled by a magnetic anisotropy of the storage layer, which defines a magnetic preferred direction. The expression "preferred direction" is conventionally used in the art, although "preferred axis" would be more correct since both directions along the axis are equally preferred. Despite this, the expression "preferred direction" is used herein.

The magnetic anisotropy may be provided by shape anisotropy. Thus, in the case of a magnetic layer having an elongated shape, the magnetic preferred direction corresponds to the geometrical longitudinal direction of the magnetic layer. Due to the requirement that the leakage field energy be as low as possible, in energetic terms, the magnetization is directed collinearly with respect to the preferred direction of the anisotropy. By applying an external magnetic field, the magnetization of the storage layer can be switched back and forth between the two energetically preferred positions, if the activation energy required to overcome the energetically unfavorable intermediate positions is provided by the external magnetic field. In practice, such a shaped anisotropy of memory cells is realized, for example, by magnetic layers that are elliptically shaped in terms of their spatial form.

In the case of rotationally symmetrical magnetic layers, by contrast, the magnetic anisotropy is obtained as an intrinsic material property because an "in-plane" shape anisotropy cannot be realized. The cause of intrinsic anisotropy is under debate, but electron diffraction data at amorphous layer materials permit a conclusion that anisotropic orientation of atomic pair axes in the direction of the magnetic field is a possible cause of the intrinsic anisotropy.

In conventional MRAM memory cells, magnetization of the storage layer is set parallel or antiparallel with respect to the magnetization of the reference layer since this makes it possible to obtain a maximum signal swing with regard to the change in resistance $\Delta R/R$ of the layer stack during magnetization reversal of the magnetization of the storage layer relative to the magnetization of the reference layer.

However, in a memory cell having a circular-disk-shaped configuration and a storage layer having weak intrinsic anisotropy, it is not possible to ensure that the magnetization of the storage layer is oriented collinearly with respect to the preferred direction. In general, a single cycle of the magnetization reversal of the storage layer establishes a remanent magnetization of the storage layer, in which case the magnetization is directed non-collinearly with respect to the preferred direction of the intrinsic anisotropy of the storage layer.

Therefore, it is desirable to provide an MRAM memory cell having a circular-disk-shaped geometry with a storage layer having only weak intrinsic magnetic anisotropy to avoid a reduced signal swing with regard to the change in resistance $\Delta R/R$ during magnetization reversal of the storage layer relative to the magnetization of the reference layer caused by a remanent magnetization of the storage layer.

SUMMARY OF THE INVENTION

According to a first embodiment of the invention, an MRAM memory cell is provided having a layer system made of circular-disk-shaped layers. The layer system comprises first and second magnetic layers separated by a nonmagnetic intermediate layer positioned between the first and second magnetic layers. The first magnetic layer (also referred to herein as the "reference layer") exhibits hard-magnetic behavior and the second magnetic layer (also referred to herein as the "storage layer") exhibits soft-magnetic behavior and stores information by its magnetization state. The storage layer is formed such that it has a weak intrinsic magnetic anisotropy that defines a magnetic preferred direction. In a variation of the first embodiment, the storage layer has a weak intrinsic anisotropy defining a magnetic preferred direction during a thermal select operation. Magnetization of the reference layer is substantially parallel to a remanent magnetization in an interior of the storage layer created as a result of applying an external magnetic field with a field component perpendicular to the magnetic preferred direction of the intrinsic anisotropy of the storage layer.

According to a second embodiment of the present invention, the storage layer of a MRAM memory cell is constructed from a plurality of individual (component) layers. The individual layers can be constructed from an identical material or from different materials. Similarly, the reference layer may be constructed from a plurality of individual (component) layers.

According to another embodiment of the present invention, a method is provided for manufacturing an MRAM memory cell, comprising: providing a layer system of substantially circular-disk-shaped layers comprising first and second magnetic layers separated by a nonmagnetic intermediate layer, the first magnetic layer exhibiting hard-magnetic behavior and serving as a reference layer and the second magnetic layer exhibiting soft-magnetic behavior and serving as a storage layer to store information by its magnetization state, the storage layer having a weak intrinsic anisotropy defining a magnetic preferred direction; generating a first, substantially homogeneous, external magnetic field during a first elevated-temperature age hardening of the layer system, a direction of the first magnetic field being oriented at an angle $\alpha$ with respect to the magnetic preferred direction of the intrinsic anisotropy of the storage layer such that the direction of the first magnetic field is substantially parallel to a magnetization direction of a remanent magnetization created in an interior of the storage layer as a result of applying an external magnetic field with a field component perpendicular to the magnetic preferred direction of the intrinsic anisotropy of the storage layer; and first elevated-temperature age hardening the layer system at a first temperature below the Curie point of the first and second magnetic layers, a field strength of the first magnetic field being greater than a saturation field strength of the reference layer such that a magnetization of the reference layer is oriented along the direction of the first magnetic field.

According to still another embodiment of the invention, the storage layer of a MRAM memory cell is a multiple component storage layer comprising a storage layer component and an antiferromagnetic layer component formed on the storage layer component. The storage layer component may comprise the storage layer of the first embodiment or the multiple layer storage layer variation of the second embodiment.

BRIEF DESCRIPTION OF THE DRAWINGS

The invention will now be explained in more detail on the basis of exemplary embodiments, reference being made to the accompanying drawings, in which.

DETAILED DESCRIPTION

According to one embodiment of the invention, an MRAM memory cell is provided having a layer system made of circular-disk-shaped layers. The layer system comprises first and second magnetic layers separated by a nonmagnetic intermediate layer positioned between the first and second magnetic layers. The first magnetic layer (also referred to herein as the "reference layer") exhibits hard-magnetic behavior and the second magnetic layer (also referred to herein as the "storage layer") exhibits soft-magnetic behavior and stores information by its magnetization state. The storage layer is formed such that it has a weak intrinsic magnetic anisotropy that defines a magnetic preferred direction. The storage layer accordingly typically has an anisotropy field strength of $\leq 1$ kA/m (approximately 12.6 Oe). In addition, a method for producing an MRAM memory cell is provided.

Figure 1A:
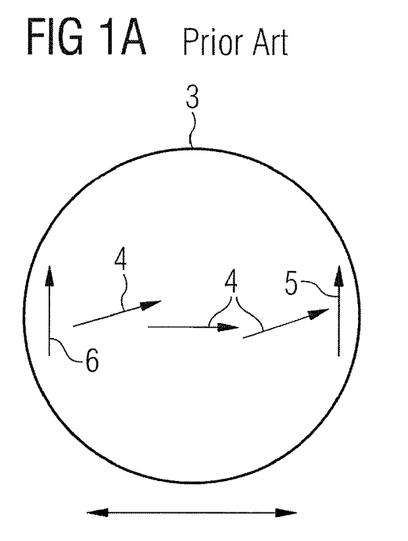
FIGS. 1A and 1B are schematic diagrams of a storage layer of a conventional MRAM memory call.
Figure 1B:
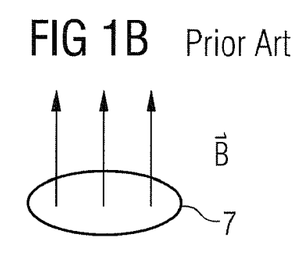
Figure 1C:
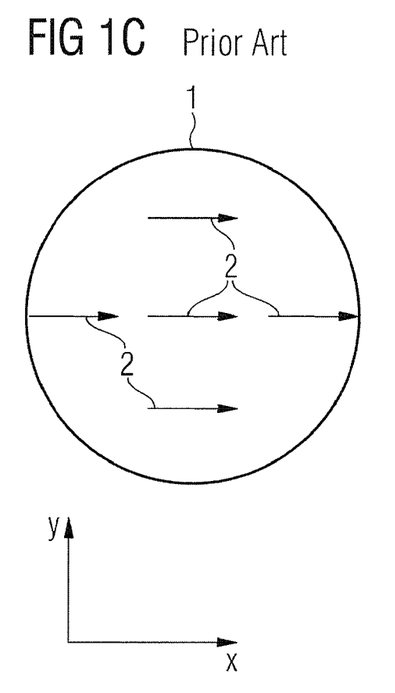
FIG. 1C is a schematic diagram of a reference layer of a conventional MRAM memory cell.

FIGS. 1A and 1B show a storage layer FIG. 1C shows a reference layer of a conventional MRAM memory cell. To facilitate reference, FIGS. 1A-1C are provided with an X, Y axis system in which the X axis points toward the right in the horizontal direction, while the Y axis points upward in the vertical direction. The reference layer 1, a layer exhibiting hard-magnetic behavior and having a circular-disc shape, is magnetized along the X axis, which is represented symbolically by the arrows 2. The storage layer 3, a layer exhibiting soft-magnetic behavior with a circular-disk shape, has a strong intrinsic anisotropy with a preferred direction indicated by the double-arrow. The preferred direction of the intrinsic anisotropy is accordingly oriented along the X axis or –X axis. In the interior of the storage layer 3, the magnetization symbolized by the arrows 4 substantially follows the course of the preferred direction of the intrinsic anisotropy. Furthermore, the magnetization 4 in the interior of the storage layer 3 is substantially oriented parallel to the magnetization 2 of the reference layer 1.

FIG. 1A shows a state of the storage layer 3 after the application and switching-off an substantially homogeneous, external magnetic field 7 (shown in FIG. 1B) directed through 90° in the counterclockwise direction relative to the X axis (remanent state). Through the action of the external magnetic field 7, the magnetization 4 in the interior of the memory cell 3 is oriented parallel to the field direction thereof, but after the magnetic field 7 has been switched off, the magnetic field reverts to a direction substantially parallel to the preferred direction of the intrinsic anisotropy. For the magnetization 5, 6 at the edge regions of the storage layer 3, by contrast, it is energetically advantageous with regard to avoiding high leakage field energies if they remain in a direction parallel to the field direction of the external magnetic field 7, even after the latter has been switched off. Although only a gradual transition of the magnetization 5, 6 of the edge regions to the magnetization 4 in the interior of the storage layer is made possible on account of the magnetic exchange interaction, the magnetization 4 in the interior of the memory cell 3, on account of the strong intrinsic anisotropy, assumes an orientation parallel to the preferred direction thereof. During magnetization reversal, the magnetization in the interior of the storage layer 3 is a collinear, i.e., parallel or antiparallel, orientation with respect to the preferred direction. As a result, magnetization 4 in the interior of the storage layer 3 and the magnetization 2 of the reference layer 1 are oriented collinearly with respect to one another and a maximum signal swing with regard to the change in resistance ΔR/R of the layer stack is possible.

Figure 2A:
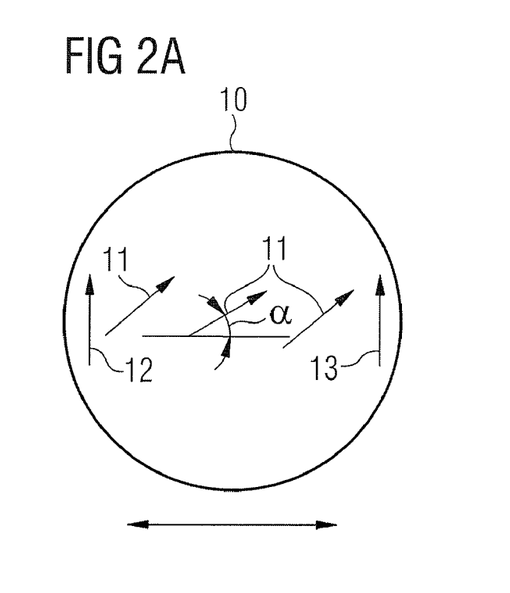
FIGS. 2A and 2B are schematic diagrams of a storage layer of a MRAM memory cell according to a first embodiment of the present invention.
Figure 2B:
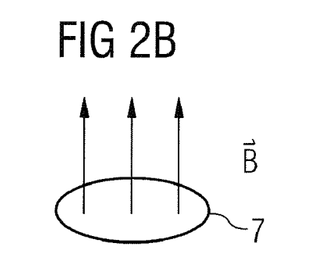

FIGS. 2A and 2B show a storage layer 10 exhibiting soft-magnetic behavior having a circular-disk shape for use in an MRAM memory cell according to one embodiment of the present invention. The behavior of a circular-disk-shaped storage layer having a weak intrinsic anisotropy differs from the behavior described above in connection with FIGS. 1A-1C. FIGS. 2A-2C employ an X, Y axis system similar to that shown in FIGS. 1A-1C. The storage layer 10 has a weak intrinsic anisotropy with a preferred direction indicated by the double arrow. Like the storage layer 3 shown in FIGS. 1A and 1B, the storage layer 10 is in a remanent state after the application and switching-off of an substantially homogeneous, external magnetic field 7 directed through 90° in the counterclockwise direction relative to the X axis. In this case, after the magnetic field 7 has been switched off, the magnetization 12, 13 in the edge regions of the storage layer 10 avoid high leakage field energies by remaining in a direction parallel to the field direction of the previously applied magnetic field. However, the magnetization in the interior of the storage layer 10 cannot attain an orientation parallel to the preferred direction due to the weak intrinsic anisotropy of storage layer. In other words, the influence of the magnetization 12, 13 in the edge regions of the storage layer 10, due to the magnetic exchange interaction, prevents a collinearity between the magnetization 11 in the interior of the storage layer 10 and the preferred direction of the intrinsic anisotropy. Consequently, a remanent magnetization 11 is established in the interior of the storage layer 10. The magnetization is oriented at an angle α in the counterclockwise direction relative to the X axis.

The term "strong intrinsic anisotropy" used herein is intended to denote those storage layers of an MRAM memory cell in which, during magnetization reversal of the storage layer, a substantially collinear orientation between the remanent magnetization in the interior of the storage layer and the preferred direction of the intrinsic anisotropy always occurs. By contrast, in the case of storage layers having a "weak intrinsic anisotropy," a remanent magnetization occurs that is oriented non-collinearly with respect to the preferred direction occurs in the interior of the storage layer. A weak intrinsic anisotropy is typically accompanied by an anisotropy field strength of less than approximately 1 kA/m (approximately 12.6 Oe).

If the remanent magnetization of the storage layer is not directed parallel or antiparallel with respect to the magnetization direction of the reference layer, this undesirable consequence that it is not possible to obtain the maximum signal swing with regard to the change in resistance ΔR/R of the layer stack during magnetization reversal of the magnetization of the storage layer relative to the magnetization of the reference layer. As shown by a computational consideration when a remanent magnetization occurs in the storage layer, it is possible to obtain a signal swing weighted with cos α with regard to the change in resistance ΔR/R. Therefore, such storage layers cannot be used, or can be used only in a very restricted manner, for application in MRAM memory cells.

Figure 2C:
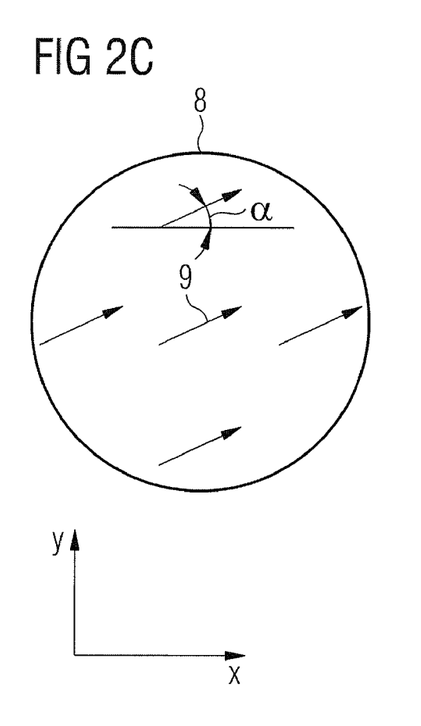
FIG. 2C is a schematic diagram of a reference layer of a MRAM memory cell according to the first embodiment.

Still referring to FIGS. 2A-2C, the storage layer 10 is formed in a circular-disk shape and has a weak intrinsic anisotropy that defines a preferred direction as indicated by the double arrow. The reference layer 8 exhibits hard-magnetic behavior and is likewise formed in a circular-disk shape. The weak intrinsic anisotropy field strength of the storage layer 10 is less than 3 kA/m during a thermal select operation. It should be understood that in all of the embodiments of the present invention described herein, the MRAM memory cell has a nonmagnetic intermediate layer positioned between and separating the storage layer and the reference layer. For example, the nonmagnetic intermediate layer is formed on the reference layer on the surface that faces the storage layer. For simplicity, the nonmagnetic intermediate layer is not shown in the figures.

FIGS. 2A and 2B show a state of the storage layer 10 after the application and switching-off of a substantially homogeneous, external magnetic field 7 directed through 90° in the counterclockwise direction relative to the X axis (remanence). Due to the weak intrinsic anisotropy and the resultant influence of the magnetization 12, 13 at the edge regions of the storage layer 10 on the magnetization 11 in the interior of the storage layer 10, a remanent magnetization 11 occurs which is oriented at an angle α in the counterclockwise direction with respect to the X axis.

In accordance with an aspect of the present invention, the magnetization 9 of the reference layer 8 is oriented at the same angle α in the counterclockwise direction with respect to the X axis, so that the remanent magnetization 11 in the interior of the storage layer 10 is oriented substantially parallel to the magnetization 9 of the reference layer 8.

Thus, according to the first embodiment of the present invention shown in FIGS. 2A-2C, an MRAM memory cell is provided having a layer system made of circular-disk-shaped layers. The layer system comprises first and second magnetic layers separated by a nonmagnetic intermediate layer positioned between the first and second magnetic layers. The first magnetic layer exhibits hard-magnetic behavior and serves as the reference layer and the second magnetic layer exhibits soft-magnetic behavior and serves as a storage layer to store information by its magnetization state. The storage layer is formed such that it has a weak intrinsic magnetic anisotropy that defines a magnetic preferred direction.

Magnetization of the reference layer is oriented parallel to a remanent magnetization in the interior of the storage layer. Such a remanent magnetization occurs in storage layers having weak intrinsic magnetic anisotropy when an external magnetic field with a field component perpendicular to the preferred direction of the intrinsic anisotropy of the storage layer is applied. This is generally always the case during a conventional magnetization reversal of the MRAM memory cell, for instance, in the form of the customary "astroid switching." In an MRAM memory cell, for magnetization reversal of the MRAM storage layer, conventional electrically conductive line traces are provided, for example, two word and bit lines through which current is driven. The magnetic field is coupled to the remanent magnetization of the storage layer. The line traces cross one another at a right angle and the layer system includes a storage layer, a reference layer, and an intermediate layer positioned at a crossover point between the line traces.

Due to the orientation of the magnetization of the reference layer in a direction parallel to the remanent magnetization of the storage layer, during magnetization reversal of the memory cell using an external magnetic field with a field component in a direction perpendicular to the preferred direction of the intrinsic anisotropy of the storage layer, magnetization of the storage layer and the reference layer are oriented collinearly, i.e., parallel or antiparallel, with respect to one another. This enables a maximum signal swing with regard to the change in resistance ΔR/R of the layer stack during magnetization reversal of the magnetization of the storage layer relative to the magnetization of the reference layer, so that even storage layers having a circular-disk-shaped, i.e., rotationally symmetrical, form and a weakly-formed intrinsic anisotropy can be employed for use as storage layers in MRAM memory cells.

Magnetization of the reference layer is oriented at an angle α with respect to the preferred direction of the intrinsic anisotropy of the storage layer. The angle α has a value in a range of 10° to 50°. If permalloys are used as material of the storage layer, the angle α is approximately 45°.

Figure 3A:
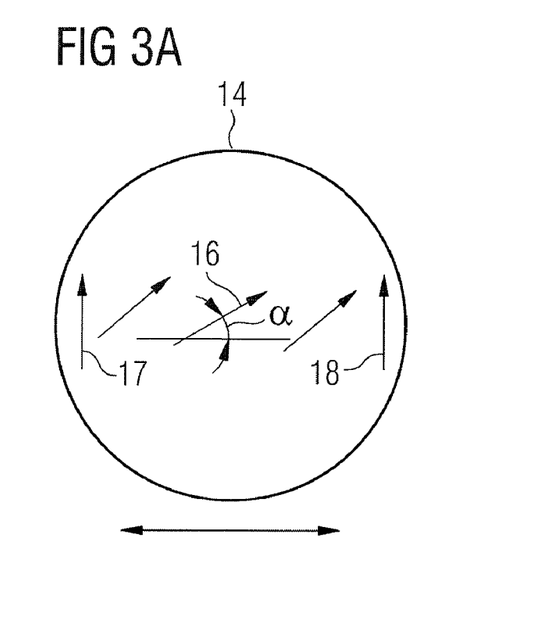
FIGS. 3A and 3B are schematic diagrams of an upper individual layer and a lower individual layer, respectively, that together make up a storage layer of a MRAM memory cell according to a second embodiment of the present invention.
Figure 3B:
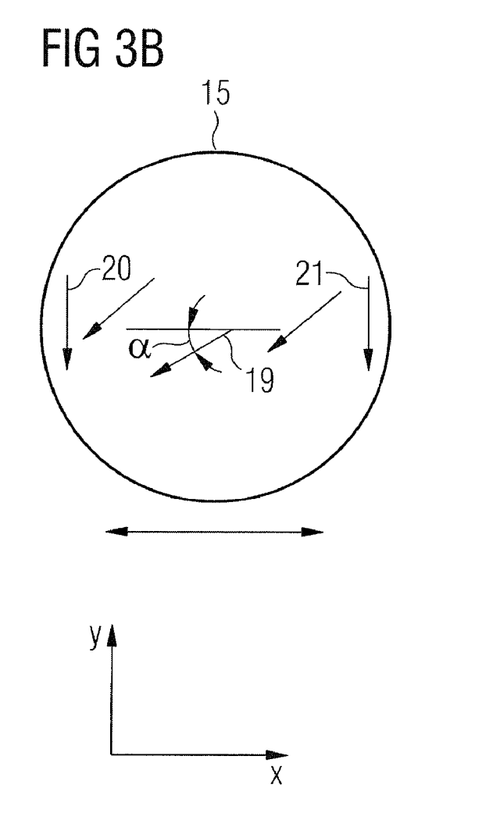

According to a second embodiment of the present invention, the storage layer may be formed form multiple individual storage layer components. FIGS. 3A and 3B show a schematic illustration of an upper individual layer component 14 and a lower individual layer component 15, respectively, of circular-disk-shaped storage layer according to another embodiment of the present invention. The two individual layers 14, 15 form the storage layer 10 shown in FIGS. 2A and 2B of an MRAM cell. It should be understood that the MRAM cell would also include a reference layer such as the reference layer 8 shown in FIG. 2C. In order to facilitate reference, FIGS. 3A and 3B employ an X, Y axis system that is similar to the X, Y axis systems of FIGS. 1C and 2C.

FIGS. 3A and 3B show a state of the individual layers 14, 15 after application and switching-off of a substantially homogeneous, external magnetic field directed through 90° in the counterclockwise direction relative to the X axis (remanence). Due to a weak intrinsic anisotropy and the resultant effect of the magnetization of the edge regions on the magnetization in the interior of the storage layers of the individual layers, a remanent magnetization 16 remains in layer 14 and a remanent magnetization remains in layer 15 that are oriented at a angle α and 180°+α, respectively, in the counterclockwise direction with respect to the X axis.

The two individual layers 14, 15 of the storage layer are coupled to one another by magnetic leakage field coupling. As a consequence, the magnetization 17, 18 in the edge region of the upper individual layer 14 is established antiparallel with respect to the magnetization 20, 21 in the edge region of the lower individual layer 15. Likewise, the magnetization 16 in the interior of the individual layer 14 is established antiparallel with respect to the magnetization 19 in the interior of the individual layer 15.

The individual layers 14, 15 of the storage layer as shown in FIGS. 3A and 3B may be part of a layer stack formed in connection with a method for manufacturing an MRAM memory cell according to an embodiment of the invention.

Firstly, a two-layered reference layer made of a Co—Fe—Ni alloy with an intervening layer made of Ru is applied on a conventional substrate. In one example, the two layers are made of a ferromagnetic alloy having a layer thickness of 2 nm, while the intervening layer is made of Ru having a layer thickness of 1 nm. The magnetization of the reference layer is oriented at an angle α=45° in the counterclockwise direction with respect to a preferred direction of the intrinsic anisotropy of the storage layer, the preferred direction corresponding to the X axis as shown in FIGS. 3A and 3B. The individual layers of the reference layer made of a Co—Fe—Ni alloy are coupled to one another by magnetic exchange coupling. A nonmagnetic intermediate layer made of AlO having a layer thickness of 3 nm is formed on the reference layer and thus is positioned between the storage layer and the reference layer. Situated above the intermediate layer is a double-layered storage layer made of an Ni—Fe alloy separated by an intermediate layer made of Ta. In this case, the two individual layers of the storage layer made of an Ni—Fe alloy correspond to the embodiment shown in FIGS. 3A and 3B. In one example, the layer thicknesses of the layers of the storage layer are in each case 3 nm, while the layer thickness of the Ta layer is 1 nm. The magnetizations of the Ni—Ne alloys are coupled to one another by magnetic leakage field coupling. The layer stack substantially has a circular-disk shape having a disk diameter of 300 nm, for example.

In order to form a weak intrinsic anisotropy in the storage layer, the layer stack is firstly subjected to heat treatment in an external magnetic field having a field strength of 100 mT. The heat treatment is performed at a temperature of 250° C., for example. Thereafter, for magnetizing the reference layer, the layer stack is subject to elevated-temperature age hardening at a temperature of 300° C., with application of a first, substantially homogeneous, external magnetic field having a field strength of 1 tesla. The field direction of the first external magnetic field is chosen to correspond to the direction of a remanent magnetization of the storage layer, i.e., the field direction of the first magnetic field assumed an angle α=45° in the counterclockwise direction with respect to the X axis. Since, in this example, the preferred direction of the intrinsic anisotropy also rotated in the field direction of the first magnetic field, a second elevated-temperature age hardening is carried out at a temperature of 250° C., but a field strength of merely 0.1 tesla is used. The field direction of the second magnetic field is chosen in such a way that it assumes an angle −α with respect to the field direction of the first magnetic field, with the result that, only the preferred direction of the intrinsic anisotropy is oriented in its original direction before the application of the first magnetic field in this example.

Thus, according to a second embodiment of the present invention, the storage layer of the MRAM memory cell can be constructed from a plurality of individual (component) layers, i.e., the storage layer is formed as a multilayer system. The individual layers can be constructed from an identical material or from different materials. The individual layer components of the storage layer are magnetically coupled by one or more of: magnetic leakage field coupling, antiferromagnetic coupling and magnetic exchange coupling. Antiferromagnetic coupling of the individual layers of the storage layer may not be feasible in certain circumstances because the forces that occur may be too large to enable an easy magnetization reversal of the storage layer in practical applications.

When a multi-layered storage layer is used, the net magnetization of the storage layer, i.e., the vectorial sum of the magnetizations of the individual layers, is zero. A mutual influencing of adjacent memory cells by the magnetizations of the magnetic layers can be avoided.

The reference layer also may be constructed from a plurality of individual (component) layers. In this case, the individual layers are magnetically coupled by one or more of: antiferromagnetic coupling, magnetic exchange coupling and magnetic leakage field coupling. With regard to the mutual influencing of adjacent memory cells, it is desirable that the net magnetization of the reference layer is zero.

Thus, one or both of the storage layer and reference layer may be constructed from a plurality of individual layer components. The materials of the storage layer and/or of the reference layer may be based on an alloy of the (Co, Ni, Fe) system. The (Co, Ni, Fe) system includes alloys which have one material component of the system or an arbitrary combination of a plurality of material components of the system, for instance, an Ni—Fe alloy or an Ni—Fe—Co alloy. In addition, the (Co, Ni, Fe) system can have further material components, such as Si and B, for example, by which an amorphous structure can be imparted to the alloys. According to still another aspect of the invention, the materials of the storage layer and/or reference layer may be amorphous alloys, such as an amorphous alloy based on the (Co, Ni, Fe) system is a Co—Fe—B alloy or a Co—Fe—Si alloy, for example.

The material of the intermediate nonmagnetic layer arranged between the storage layer and the reference layer can be AlO. If the storage layer and/or reference layer are/is formed from multiple layer components, the individual layer components can be separated from one another by intermediate or intervening layers comprised of Ta or Ru, for example.

Accordingly, a method is provided for manufacturing an MRAM memory cell, comprising: providing a layer system of circular-disk-shaped layers; generating a first, substantially homogeneous, external magnetic field during a first elevated-temperature age hardening of the layer system, to age harden the layer system at a first elevated temperature at a temperature below the Curie point of storage layer and reference layer. The layer system includes first and second magnetic layers separated by a nonmagnetic intermediate layer. The first magnetic layer (reference layer) exhibits hard-magnetic behavior. The second magnetic layer (storage layer) exhibits soft-magnetic behavior. Information is stored by the magnetization state of the second magnetic layer. In addition, the storage layer has a weak intrinsic magnetic anisotropy defining a magnetic preferred direction. The direction of the first magnetic field is chosen to be oriented at an angle $\alpha$ with respect to the preferred direction of the intrinsic anisotropy of the storage layer, i.e., the direction of the first magnetic field is substantially parallel to the magnetization of a remanent magnetization in the interior of the storage layer. The remanent magnetization of the storage layer occurs as a result of the application of an external magnetic field with a field component perpendicular to the preferred direction of the intrinsic anisotropy of the storage layers, which is generally the case during magnetization reversal of the MRAM memory cells. The field strength of the first magnetic field is greater than the saturation field strength of the reference layer, so that the magnetization of the reference layer is oriented along the field direction of the first magnetic field.

Consequently, magnetization of the reference layer is achieved during the first elevated-temperature age hardening of the layer system. The magnetization of the reference layer is directed parallel to the reference magnetization of the storage layer. The first magnetic field is oriented such that the angle a has a value in a range of 10° to 50°.

Depending on the field strength of the applied first magnetic field and the material properties of the storage layer, the preferred direction of the weak intrinsic anisotropy of the storage layer is oriented in the field direction of the first magnetic field. This is undesirable, however, since a remanent magnetization occurring during magnetization reversal in the storage layer ensures that the magnetization directions of the reference layer and of the storage layer are no longer collinear. Therefore, the manufacturing method further includes generating a second, substantially homogeneous, external magnetic field during a second elevated-temperature age hardening of the layer system to age harden the layer system at a temperature below the Curie point of the two magnetic layer systems. The direction of the second magnetic field is at an angle $-\alpha$, i.e., an angle diametrically opposite to the angle $\alpha$ with respect to the direction of the first magnetic field. The field strength of the second magnetic field is less than the saturation field strength of the reference layer, so that the magnetization of the reference layer remains substantially unchanged during the second elevated-temperature age hardening. The preferred direction of the weak intrinsic anisotropy of the storage layer is oriented along the field direction of the second magnetic field.

The preferred direction of the intrinsic anisotropy of the storage layer is directed in its original direction before the first elevated-temperature age hardening, so that the remanent magnetization of the storage layer and the magnetization of the reference layer are substantially collinear.

The distinction made here between a "first" elevated-temperature age hardening and a "second" elevated-temperature age hardening, including the associated distinctions for the temperatures and the magnetic fields, is for reasons of clarity. The second elevated-temperature age hardening step of the process may be omitted as explained in the foregoing.

Nevertheless, a first temperature during the first elevated-temperature age hardening step and a second temperature during the second elevated-temperature age hardening step may be in a range of 250° C. to 350° C. The field strength of the first magnetic field may have a value in a range of 0.1 to 2 tesla, while the field strength of the second magnetic field may have a value in a range of 0.001 to 0.1 tesla.

The storage layer may be formed in intrinsic anisotropic fashion by heat treatment in an external magnetic field. Alternatively, the storage layer may be formed by oblique ion beam sputtering or ion beam sputtering in an external magnetic field.

Figure 4A:
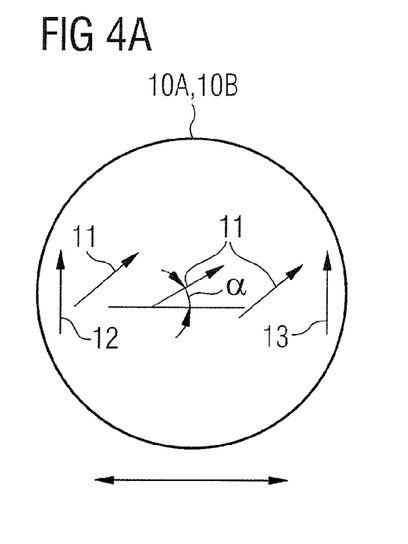
FIGS. 4A and 4B are schematic diagrams for a storage layer component and a antiferromagnetic layer component that together make up a storage layer of a MRAM memory cell according to a third embodiment of the present invention.
Figure 4B:
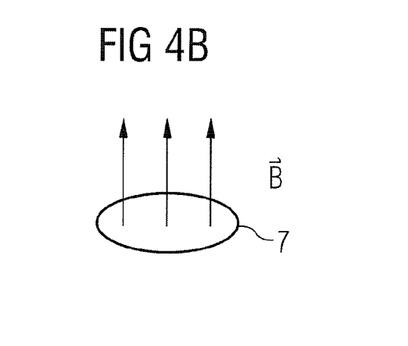
Figure 4C:
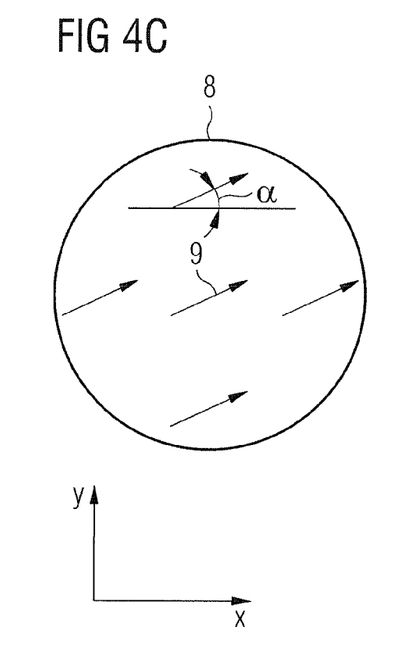
FIG. 4C is a schematic diagram of a reference layer of the MRAM memory cell according to the third embodiment.
Figure 4D:
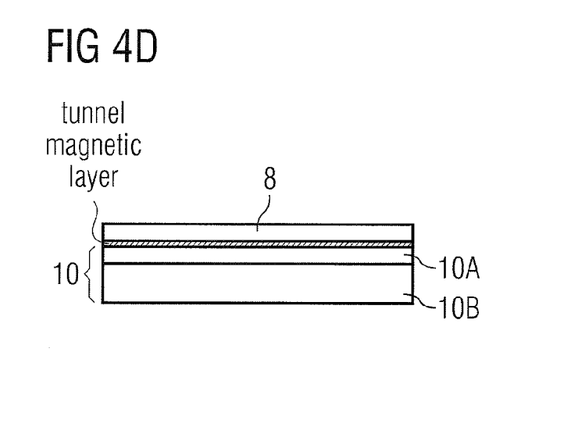
FIG. 4D is a side view showing a stacking sequence or layer orientation of the MRAM memory cell according to the third embodiment.

An MRAM memory cell according to still another embodiment of the invention is shown in FIGS. 4A to 4D. The MRAM memory cell of the embodiment shown in FIGS. 4A-4D is similar to the embodiment shown in FIGS. 2A to 2C except that the storage layer 10 comprises a storage layer component 10A and an antiferromagnetic layer component 10B formed on the storage layer component 10A on a surface that is opposite to the reference layer when the MRAM cell is fabricated. The storage layer component 10A may be embodied by the storage layer 10 of the first embodiment or by multiple individual storage layers 14, 15 of the second embodiment. Suitable materials for the antiferromagnetic layer component 10B are FeMn, PtMn, or IrMn, for example, and the storage layer 10A may be formed from a material selected from a group consisting of Ni, Fe, and Co. The layer thickness of the antiferromagnetic layer 10B may be in a range between 2 to 20 nm, and the layer thickness of the storage layer 10A may be in a range between 3 to 10 nm, for example. It should be understood that other suitable materials and thicknesses may be selected. FIG. 4D is a side view illustrating the stacking sequence or orientation of the layers of the MRAM memory cell of this embodiment.

The multiple component storage layer 10 depicted in FIGS. 4A-4D exhibits an anisotropical behavior that is dependent on temperature. At temperatures which are above a critical temperature (called a "blocking temperature") of about 150° C. the multiple component storage layer 10 has a low anisotropy, and at temperatures which are below the blocking temperature, the anisotropy of the multiple component storage layer 10 sequence is high. Due to this temperature dependent anisotropy, a writing process of a MRAM memory cell of this embodiment of the present invention is performed at high temperatures with (corresponding to) a low anisotropy, and a reading process is performed at low temperatures with (corresponding to) a high anisotropy. Since reading is performed at low temperatures the respective resistance values of the MRAM memory cell are clearly distinct from each other with a fixed zero point so that data reading and data retention are improved.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. An MRAM memory cell, comprising:
   a layer system of substantially circular-disk-shaped layers comprising first and second magnetic layers and a nonmagnetic intermediate layer separating the first and second magnetic layers, wherein the first magnetic layer exhibits hard-magnetic behavior and serves as a reference layer and the second magnetic layer exhibits soft-magnetic behavior and serves as a storage layer to store information by its magnetization state, wherein the storage layer has a weak intrinsic anisotropy defining a magnetic preferred direction, wherein magnetization of the reference layer is substantially parallel to a remanent magnetization in an interior of the storage layer created as a result of applying an external magnetic field having a field component perpendicular to the magnetic preferred direction of the intrinsic anisotropy of the storage layer.

2. The MRAM memory cell as claimed in claim 1, wherein the magnetization of the reference layer is directed at an angle $\alpha$ with respect to the magnetic preferred direction of the intrinsic anisotropy of the storage layer, the angle $\alpha$ having a value in the range of 10° to 50°.

3. The MRAM memory cell as claimed in claim 1, wherein one or both of the first and second magnetic layers is constructed from a plurality of individual layers.

4. The MRAM memory cell as claimed in claim 3, wherein magnetization of the individual layers of the storage layer and/or reference layer are coupled by a magnetic coupling selected from the group consisting of: magnetic leakage field coupling, antiferromagnetic coupling, and exchange coupling.

5. The MRAM memory cell as claimed in claim 3, wherein the net magnetization of the storage layer and/or reference layer is substantially zero.

6. The MRAM memory cell as claimed in claim 1, wherein the reference layer and/or storage layer are constructed from a material based on an alloy of the (Co, Ni, Fe) system.

7. The MRAM memory cell as claimed in claim 6, wherein one or both of the storage layer and the reference layer is constructed of a material comprising amorphous alloys.

8. An MRAM memory cell comprising:
   a layer system of substantially circular-disk-shaped layers comprising first and second magnetic layers and a nonmagnetic intermediate layer separating the first and second magnetic layers, wherein the first magnetic layer exhibits hard-magnetic behavior and serves as a reference layer and the second magnetic layer exhibits soft-magnetic behavior and serves as a storage layer to store information by its magnetization state, wherein the storage layer has a weak intrinsic anisotropy defining a magnetic preferred direction during a thermal select operation, wherein magnetization of the reference layer is substantially parallel to a remanent magnetization in an interior of the storage layer created as a result of applying an external magnetic field with a field component perpendicular to the magnetic preferred direction of the intrinsic anisotropy of the storage layer.

9. The MRAM memory cell as claimed in claim 8, wherein the magnetization of the reference layer is directed at an angle $\alpha$ with respect to the preferred direction of the intrinsic anisotropy of the storage layer, the angle $\alpha$ having a value in the range of 10° to 50°.

10. The MRAM memory cell as claimed in claim 8, wherein one or both of the reference layer and the storage layer is constructed of material based on an alloy comprising at least one of Co, Ni and Fe.

11. The MRAM memory cell as claimed in claim 8, wherein one or both of the storage layer and the reference layer is constructed of a material comprising amorphous alloys.

12. The MRAM memory cell as claimed in claim 8, wherein the storage layer has a weak intrinsic anisotropy field strength of less than 3 kA/m during the thermal select operation.

13. The MRAM memory cell as claimed in claim 8, and further comprising an antiferromagnetic layer on said storage layer.

14. The MRAM memory cell as claimed in claim 13, wherein the antiferromagnetic layer is on a surface of said storage layer opposite to said reference layer.

15. The MRAM memory cell as claimed in claim 13, wherein the antiferromagnetic layer comprises a thickness in a range between 2 to 20 nm.

16. The MRAM memory cell as claimed in claim 13, wherein the antiferromagnetic layer comprises a material which is selected from the group consisting of: FeMn, PtMn and IrMn.

17. The MRAM memory cell as claimed in claim 8, wherein the storage layer comprises thickness between 3 to 10 nm.

18. A method for producing an MRAM memory cell, comprising:
   (A) providing a layer system of substantially circular-disk-shaped layers comprising first and second magnetic layers separated by a nonmagnetic intermediate layer, the first magnetic layer exhibiting hard-magnetic behavior and serving as a reference layer and the second magnetic layer exhibiting soft-magnetic behavior and serving as a storage layer to store information by its magnetization state, the storage layer having a weak intrinsic anisotropy defining a magnetic preferred direction;
   (B) generating a first, substantially homogeneous, external magnetic field during a first elevated-temperature age hardening of the layer system, a direction of the first magnetic field being oriented at an angle $\alpha$ with respect to the magnetic preferred direction of the intrinsic anisotropy of the storage layer such that the direction of the first magnetic field is substantially parallel to a magnetization direction of a remanent magnetization created in an interior of the storage layer as a result of applying an external magnetic field with a field component perpendicular to the magnetic preferred direction of the intrinsic anisotropy of the storage layer; and
   (C) first elevated-temperature age hardening the layer system at a first temperature below the Curie point of the first and second magnetic layers, a field strength of the first magnetic field being greater than a saturation field strength of the reference layer such that a magnetization of the reference layer is oriented along the direction of the first magnetic field.

19. The method as claimed in claim 18, wherein (A) providing comprises providing an antiferromagnetic layer on said storage layer.

20. The method as claimed in claim 18, wherein (B) generating comprises generating the first magnetic field such that the angle $\alpha$ has a value in the range of 10° to 50°.

21. The method as claimed in claim 18, and further comprising:
(D) generating a second, substantially homogeneous, external magnetic field during a second elevated-temperature age hardening of the layer system, a direction of the second magnetic field being directed at an angle $-\alpha$ with respect to the direction of the first magnetic field, a field strength of the second magnetic field being less than the saturation field strength of the reference layer, such that the magnetization of the reference layer substantially remains unchanged and the magnetic preferred direction of the intrinsic anisotropy of the storage layer is oriented along the field direction of the second magnetic field; and
(E) second elevated-temperature age hardening of the layer system at a second temperature below the Curie point of the first and second magnetic layers.

22. The method as claimed in claim 21, wherein (C) hardening comprises hardening at the first temperature that is in a range of 250° C. to 350° C. and (D) hardening comprises hardening at the second temperature that is in a range of 250° C. to 350° C.

23. The method as claimed in claim 21, wherein the first temperature and the second temperature are substantially the same.

24. The method as claimed in claim 21, wherein (D) generating comprises generating the second magnetic field with a field strength in a range of 0.001 to 0.1 tesla.

25. The method as claimed in claim 18, wherein (B) generating comprises generating the first magnetic field with a field strength in a range of 0.1 to 2 tesla.

26. The method as claimed in claim 18, and further comprising forming the storage layer in intrinsic anisotropic fashion by heat treatment in an external magnetic field.

27. The method as claimed in claim 18, and further comprising forming the storage layer in intrinsic anisotropic fashion by oblique ion beam sputtering.

28. The method as claimed in claim 18, wherein forming the storage layer comprises ion beam sputtering in an external magnetic field.

* * * * *